United States Patent
Tran (10) Patent No.: US 6,312,997 B1
(45) Date of Patent: *Nov. 6, 2001

(54) LOW VOLTAGE HIGH PERFORMANCE SEMICONDUCTOR DEVICES AND METHODS

(75) Inventor: Luan C. Tran, Meridian, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,904

(22) Filed: Aug. 12, 1998

(51) Int. Cl.[7] ............... H01L 21/336; H01L 21/8238
(52) U.S. Cl. .................. 438/303; 438/230; 438/305
(58) Field of Search ................... 438/302, 275, 438/279, 289, 303, 305, 306, 307, 525, 521, 529, 588, 595, 232, 18, 217, 230; 257/296

(56) References Cited

U.S. PATENT DOCUMENTS

| | | |
|---|---|---|
| 3,912,545 | 10/1975 | Armstrong . |
| 4,232,439 * | 11/1980 | Shibata .................. 438/302 |
| 4,418,094 | 11/1983 | See et al. . |
| 4,839,301 | 6/1989 | Lee et al. . |
| 4,845,047 | 7/1989 | Holloway et al. . |
| 5,021,353 | 6/1991 | Lowrey et al. . |
| 5,073,509 | 12/1991 | Lee . |
| 5,087,951 | 2/1992 | Chance et al. . |
| 5,252,504 | 10/1993 | Lowrey et al. . |
| 5,260,593 | 11/1993 | Lee . |
| 5,331,191 | 7/1994 | Sugiura et al. . |
| 5,355,006 * | 10/1994 | Iguchi ......................... 257/296 |
| 5,355,066 * | 10/1994 | Iguchi ......................... 257/296 |
| 5,372,957 * | 12/1994 | Liang et al. .................. 438/302 |
| 5,413,945 * | 5/1995 | Chien et al. .................. 438/217 |
| 5,508,541 | 4/1996 | Hieda et al. . |
| 5,572,040 | 11/1996 | Reedy et al. . |
| 5,612,630 | 3/1997 | Wright et al. . |
| 5,624,863 | 4/1997 | Helm et al. . |
| 5,648,672 | 7/1997 | Hasegawa et al. . |
| 5,650,350 | 7/1997 | Dennison et al. . |
| 5,656,836 | 8/1997 | Ikeda et al. . |
| 5,661,045 | 8/1997 | Manning et al. . |
| 5,670,392 * | 9/1997 | Ferla et al. ..................... 438/18 |
| 5,693,505 | 12/1997 | Kobayashi . |
| 5,736,416 * | 4/1998 | Johansson ..................... 438/302 |
| 5,834,347 * | 11/1998 | Fukatsu et al. ................ 438/232 |

FOREIGN PATENT DOCUMENTS

| | | | |
|---|---|---|---|
| 04274370 * | 9/1992 | (JP) | ............... H01L/29/788 |
| 04329632 * | 11/1992 | (JP) | ............... H01L/21/265 |
| 09289315 * | 11/1997 | (JP) | ............... H01L/29/78 |

* cited by examiner

Primary Examiner—Trung Dang
Assistant Examiner—Brook Kebede
(74) Attorney, Agent, or Firm—Dickstein Shapiro Morin & Oshinksy LLP (57) ABSTRACT

A method for adjusting $V_t$ while minimizing parasitic capacitance for low voltage high speed semiconductor devices. The method uses shadow effects and an angled punch through prevention implant between vertical structures to provide a graded implant. The implant angle is greater than or equal to arc tangent of S/H where S is the horizontal distance between, and H is the height of, such vertical structures.

31 Claims, 9 Drawing Sheets

LOW VOLTAGE HIGH PERFORMANCE SEMICONDUCTOR DEVICES AND METHODS

FIELD OF THE INVENTION

This invention relates to low voltage, high performance semiconductor devices, such as MOS transistors for dynamic random access memory (DRAM) cells and logic applications, and to methods for fabricating such devices. More specifically, the present invention relates to methods for adjusting threshold voltage for high speed semiconductor transistor devices without the need for any additional masks.

BACKGROUND OF THE INVENTION

MOS processes typically begin with a lightly-doped P-type or N-type silicon substrate. For the sake of simplicity, the conventional MOS process will be described using P-type silicon as the starting material. If N-type silicon were used, the process steps would be virtually identical, with the exception that the dopant types would be reversed.

Silicon, the most commonly used semiconductor material can be made conductive by doping (introducing an impurity into the silicon crystal structure) with either an element such as boron, which has one less valence electron than silicon, or with elements such as phosphorus or arsenic, which have one more valence electron than silicon.

In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If dopants of opposite type conductivity are used, counter-doping will result, and the conductivity type of the most abundant impurity will prevail.

The P-well regions are oxidized using a conventional LOCOS (LOCal Oxidation of Silicon) step to create a silicon oxide layer. During the LOCOS process, the pad oxide serves as a stress relief layer. Alternatively, oxide growth and oxide deposition steps over silicon trench can replace the LOCOS step.

The channel regions of the future N-channel transistors are then exposed to a high-energy boron punch-through implant. This implant increases both source-to-drain breakdown voltage and the threshold voltage ($V_t$), thus avoiding short-channel effects. The successful operation of MOS circuits is very dependent on the ability to control threshold voltage ($V_t$). The threshold voltage ($V_t$) of a transistor is the voltage necessary for turning the transistor on or off. Accurate control of $V_t$ is made possible by ion implantation. $V_t$ adjustment implantation into the channel usually takes place through a sacrificial gate oxide, before the growth of a gate oxide and deposition of the polysilicon for the gate electrodes.

In conventional MOS processes, after $V_t$ adjustment a layer of polysilicon is then deposited on top of the gate oxide using conventional means (e.g., chemical vapor deposition). The poly layer is then doped with phosphorus, and coated with a layer of tungsten silicide by various possible techniques (e.g., chemical vapor deposition, sputtering, or evaporation). A further photomask then patterns the silicide-coated polysilicon layer to form the transistor gates.

The N-channel source and drain regions are next exposed to a relatively low-dosage phosphorus implant which creates lightly-doped drain (LDD) N-regions. Following the stripping of this mask, a layer of silicon dioxide or nitride is deposited on the wafer. An anisotropic etch and a subsequent optional isotropic etch of the silicon dioxide layer leave oxide spacers on the sides of each transistor gate.

A photomask then exposes the source and drain regions to a relatively high-dosage phosphorus or arsenic implant, which creates heavily-doped N+ regions. A photomask is then used to define contacts which will pass through an isolation oxide, e.g., BPSG glass, layer to the poly structures or active area conductive regions below. A deposition of an aluminum metal layer follows. Another photomask is then used to pattern the aluminum layer for circuit interconnects. Using a blanket deposition process, the circuitry is then covered with one or more passivation layers. An additional photomask then defines bonding pad openings, which will expose bonding pad regions on the aluminum layer below. This completes a conventional MOS process.

The business of producing semiconductor devices is a very competitive, high-volume business. Process efficiency and manufacturability, as well as product quality, reliability, and performance (speed) are key factors that determine success or failure. Each new generation of devices is expected to be faster and more compact than the generation it replaces.

In low voltage design, low threshold voltage ($V_t$) is essential since the current drive is proportional to ($V_G$-$V_t$) where $V_G$ is the gate voltage. Because very precise quantities of impurity can be introduced using ion implantation, it is possible to maintain close control of $V_t$. A problem arises, however, in connection with ion implantation for punch through prevention in such devices. Implanting a boron dopant, for example, for punch through prevention increases $V_t$, and creates a barrier layer at the junction between the N+ type source and drain regions and the underlying P-type substrate, thus increasing parasitic capacitance at this junction. This parasitic capacitance reduces the speed of the device.

A method is needed for adjusting $V_t$, while minimizing parasitic capacitance and without introducing any additional photomasking steps.

SUMMARY OF THE INVENTION

The invention provides a low voltage, high speed semiconductor transistor device having low $V_t$ and reduced parasitic capacitance. Reduction in parasitic capacitance, and hence increase in speed, is achieved by shadowing out an angled punch through prevention ion implant between a transistor gate and adjacent structures to shadow out a portion of the implant. The resulting, minimally diffused implant results in a relatively lighter dose toward the edge of the transistor gate than the central regions of the source and drain, thus reducing $V_t$ and parasitic junction capacitance in those regions. The low $V_t$ and reduced parasitic capacitance devices may be produced together with higher $V_t$ devices elsewhere on the chip without any additional masking steps to make the low $V_t$ devices.

BRIEF DESCRIPTION OF THE DRAWINGS

FIG. 2 is a view of the FIG. 1 wafer taken at a step subsequent to that shown by FIG. 1. FIG. 2 shows the formation of actual gate, and dummy gate (or poly runners over field oxide), structures at a predetermined height (H) and spacing (S). FIG. 2 also shows formation of a lightly doped drain LDD between such structures.

FIG. 4 is a view of the FIG. 1 wafer taken at a step subsequent to that shown by FIG. 3, and shows spacering of actual gate, and dummy gates (or poly runners over field oxide), and angled implant for punch through prevention. FIG. 4 also shows a gradation in the P-N junction region of the active area as a result of the shadow effects caused by the angled implant and the structures at distances H and S.

DETAILED DESCRIPTION OF THE PREFERRED EMBODIMENT

The figures are not meant to be actual cross-sectional views of any particular portion of a real semiconductor device, but are merely convenient tools employed to more fully depict the process aspect of the invention at various stages of manufacture.

The term "substrate" herein shall be understood to mean one or more semiconductive layers or structures which include active or operable portions of semiconductor devices.

An exemplary construction of a fabrication process for a low voltage semiconductor transistor device according to one embodiment of the present invention is described below. It is to be understood, however, that this process is only one example of many possible processes. For example, the angled $V_t$ adjustment implant is shadowed out by a transistor gate and a dummy gate in the following process. A series of actual gates, interconnect structures and actual, or dummy, gates, poly runners or other structures could also be used. As another example, additional implant steps may be employed to optimize impurity profiles in particular regions, and the sequence of implant steps could be changed so long as the punch through prevention implant is carried out after one or more structures are deposited and subsequently patterned with sufficient height and sufficiently small spacing to shadow out the angled implant.

Figure 1:
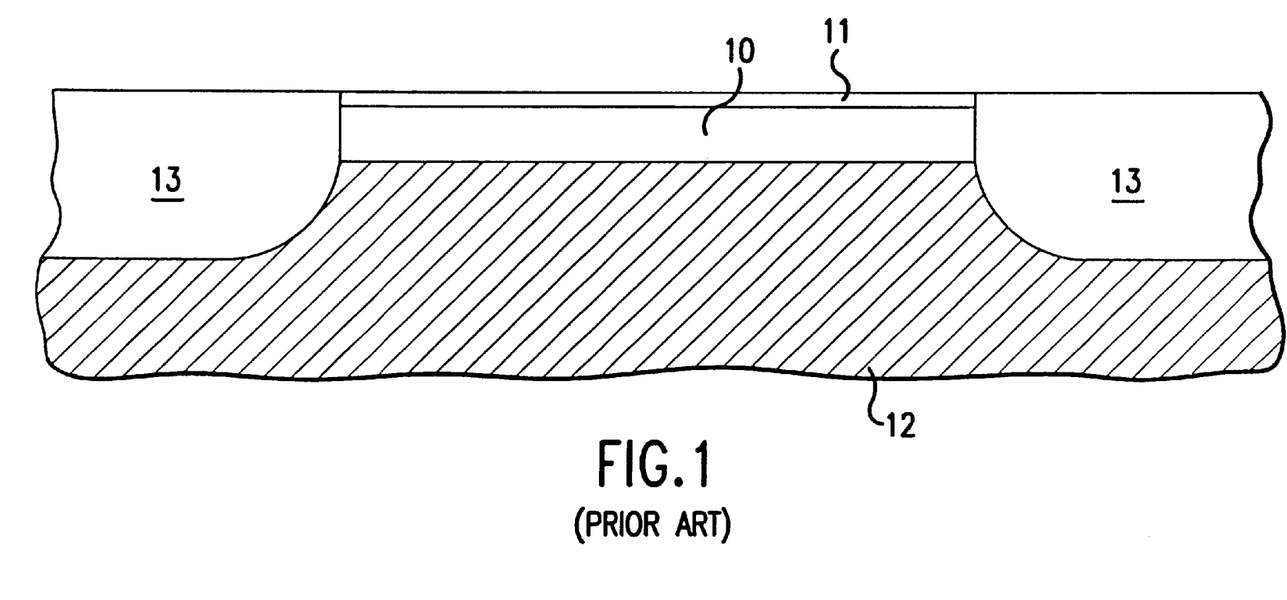
FIG. 1 is a sectional view of a semiconductor wafer fragment at one processing step in accordance with the invention.

Referring to FIG. 1, a first pad oxide layer 11 is grown on lightly-doped P-type silicon substrate 12. Silicon substrate 12 is isolated into active region 10 by field oxide regions 13. LOCal Oxidation of Silicon (LOCOS), shallow trench isolation (STI) or other field isolation techniques known in the art are used to provide oxide regions 13 for patterning silicon substrate 12 into active region 10. As an example of an STI process, a silicon nitride layer (not shown) can be deposited on a silicon dioxide layer which is previously thermally grown on silicon substrate 12. The silicon nitride layer is patterned such that the silicon nitride layer remains only on active region 10. A silicon trench is then etched to a depth of typically 2–3 times the junction depth of the devices, i.e., about 0.20 to 0.40 micron. The silicon sidewalls and trench bottom are then oxidized to a thickness of about 100–200 angstroms to serve as a liner. Then a high conformal oxide deposition is performed to fill both the trench and the wide open field area. The oxide is subsequently planarized by chemical mechanical polishing (CMP) to the level of the nitride underneath, to expose the nitride. The STI process is preferred in the method of the present invention due to the greater degree of flatness or planarity which it provides.

Figure 2:
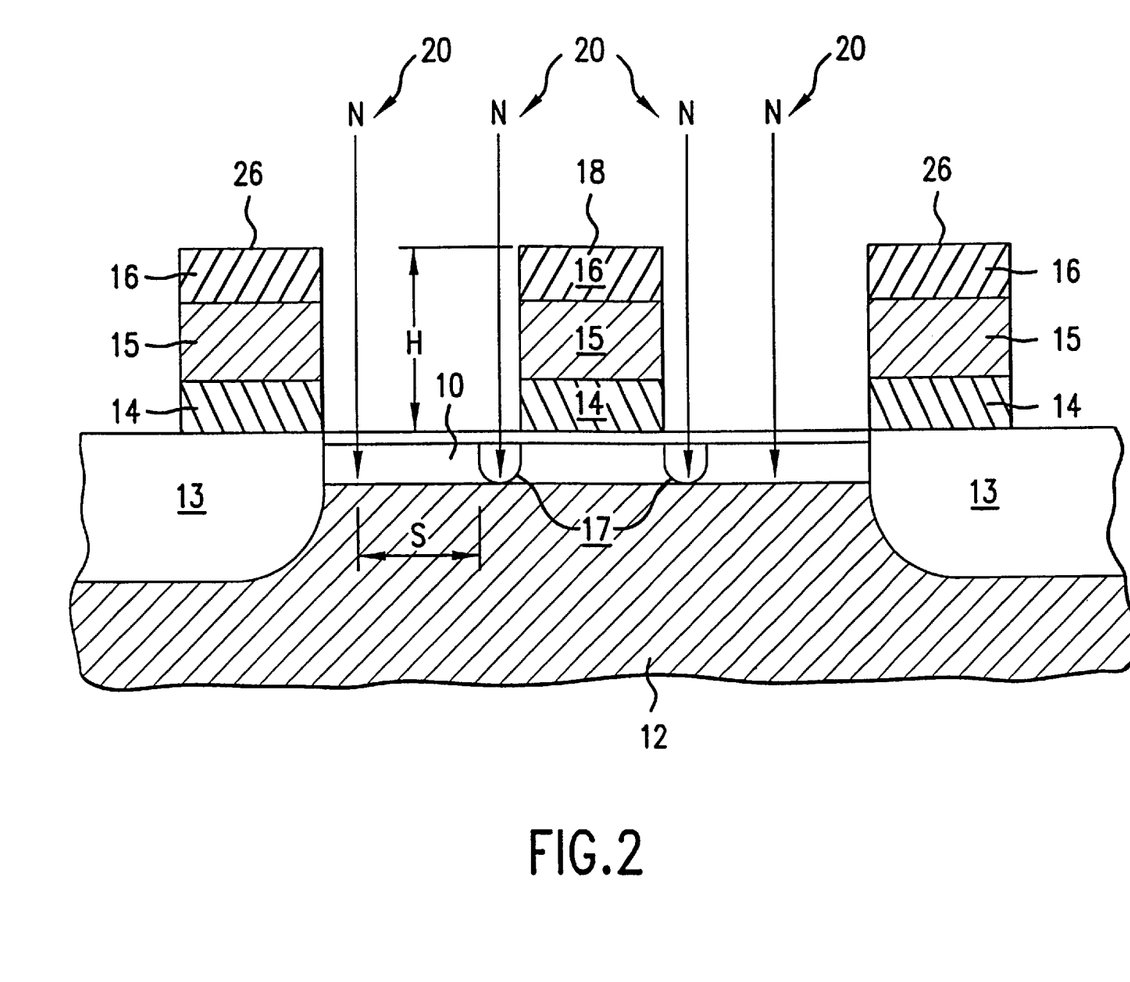

Referring to FIG. 2, after isolation of active region 10, gate structure 18 which includes polycrystalline silicon 14, an overlying silicide layer 15 such as tungsten silicide or other highly conductive materials, and an insulating cap 16, preferably $SiO_2$ or $Si_3N_4$, are formed using conventional semiconductor gate processing techniques. In FIG. 2 gate structure 18 is the actual transistor gate above active region 10. Gate structures 26 above field oxide regions 13 are dummy gates or poly runners. Dummy gates 26 are preferably formed at the same time and using the same steps as used for formation of gate structure 18. The height (H) of deposited polycrystalline silicon 14, silicide 15 and cap 16 (with optional spacer material) is the desired final height of gate structure 18 and dummy gate structures 26 for the semiconductor device. This height (H) is preferably greater than conventional gate structures so as to facilitate the shadow effects of the angled implant to adjust $V_t$ in subsequent steps. Patterned photoresist is used as an etch mask in forming gate structure 18 and dummy gates 26. In FIG. 2, the patterned photoresist has been removed.

Referring still to FIG. 2, after formation of gate structure 18, a conventional self-aligning lightly doped (LDD) implant 20 is performed to form lightly doped regions 17 as shown. For N-channel semiconductor devices, the LDD implant 20 is an N-type dopant. For a P-channel device, the LDD implant is a P-type dopant.

The implant energy of the LDD implant 20 is sufficient to penetrate the exposed portion of active region 10 but not sufficient to penetrate active region 10 under gate structure 18. Thus, gate structure 18 serves as an implant mask to block the LDD implant 20. In LDD region 17, the implant energy of the LDD implant 20 controls the peak concentration depth. Lightly doped drain region 17 reduces the electric field of the semiconductor device by grading the doping level of active region 10. This doping level gradation is discussed below in connection with FIG. 4.

Although not shown in FIG. 2, a patterned photoresist may optionally be used to prevent self-aligning LDD implant 20 from penetrating other active regions which do not require the implant. The photoresist covered active regions include those used for semiconductor devices with a channel of a different conductivity type compared to that of the semiconductor device of gate structure 18 or to block certain species from being implanted into the memory array. The patterned photoresist is removed after performing LDD implant 20.

Figure 3:
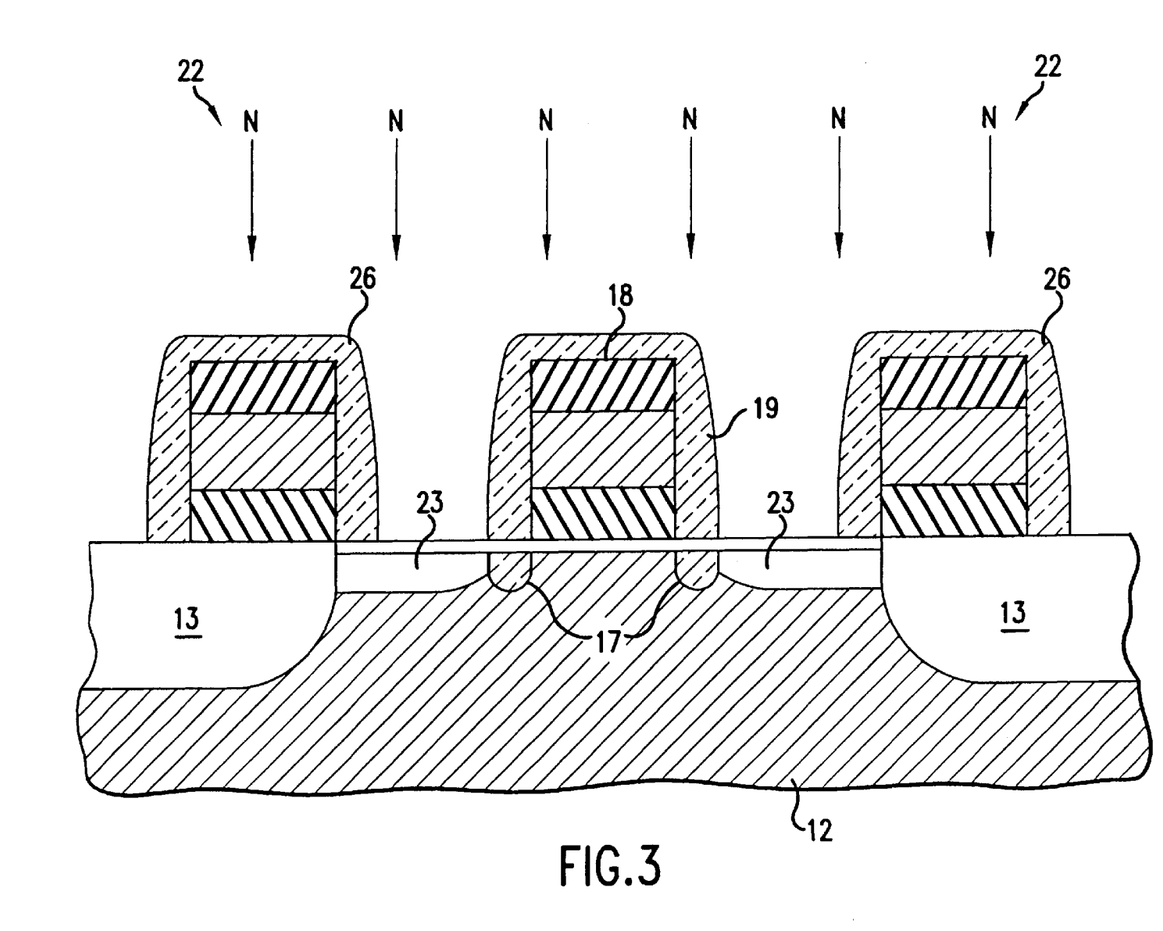
FIG. 3 is a view of the FIG. 1 wafer taken at a step subsequent to that shown by FIG. 2, and shows self-aligned formation of source and drain regions.

Referring to FIG. 3, LDD implant 20 is followed by a chemical vapor deposition (CVD) of oxide or nitride to create a spacer oxide layer 19 having a thickness in the range of 200 to 2000 angstroms, depending upon device geometry. Spacer oxide layer 19 is then etched with an anisotropic etch, to form a set of sidewall spacers 19 for transistor gates 18. Spacer oxide layer 19 coats the sides of transistor gate 18, so that when the wafer is subsequently subjected to an N-type implant, N-type source/drain regions are created for N-channel devices, and these N-type source/drain regions are offset from the vertical boundaries of LDD implant regions 17 by the vertical segments of spacer oxide layer 19 on the edge of the N-channel transistor gates 18.

Referring still to FIG. 3, a high-dosage arsenic or phosphorus implant then creates self-aligned heavily doped N-type source/drain regions 23 for N-channel devices. The high-dosage implant is self-aligned to the edges of the N-channel transistor gate 18.

FIG. 3 depicts self-aligning implant 22 performed after formation of gate structure 18 and oxide spacer 19. The self-alignment of implant 22 is particularly preferred for small geometry devices. Implant 22 introduces dopant into active region 10 to overlap LDD region 17 to form source and drain regions 23. To form semiconductor devices with an N-channel, dopant 22 is a dopant having an N-type conductivity such as phosphorous, arsenic, or the like. Dopant 22 is, of course, of a different conductivity type than that of the substrate to form a semiconductor device with a channel of the different conductivity type.

The implant energy of dopant 22 during implant 22 is sufficient to penetrate active region 10 in source and drain region 23, i.e., the implant energy is preferably low to form shallow junctions. Gate structure 18 serves as an implant mask to block implant 22. In source and drain region 23, the implant energy of dopant 22 controls the depth of the peak concentration of implant 22. An additional implant can be used to optimize the dopant profile of source and drain region 23.

As depicted in FIG. 3, a portion of source and drain region 23 will exist underneath a portion of spacer 19, in that a portion of LDD region 17 exists underneath a portion of gate structure 18 since the LDD implant is performed prior to the formation of spacer 19. Thus, a portion of LDD region 17 is converted into source and drain region 23 by implant 22. LDD region 17 and source and drain region 23 are of the same conductivity type. As shown in FIG. 3, spacer 19 is used to block implant 22 from completely overlapping LDD region 17. Since the dose of implant 22 is higher than the dose of the LDD implant, the doping concentration of source and drain region 23 is higher than the doping concentration of LDD region 17, and the doping concentration of LDD region 17 does not significantly affect the doping concentration of source and drain region 23. Source and drain region 23 has a higher N-type doping concentration, and LDD region 17 has a lower N-type doping concentration. A portion of the original LDD region exists to provide a graded doping concentration to reduce the electric field in active region 10 to increase the breakdown voltage of the semiconductor device.

Figure 4:
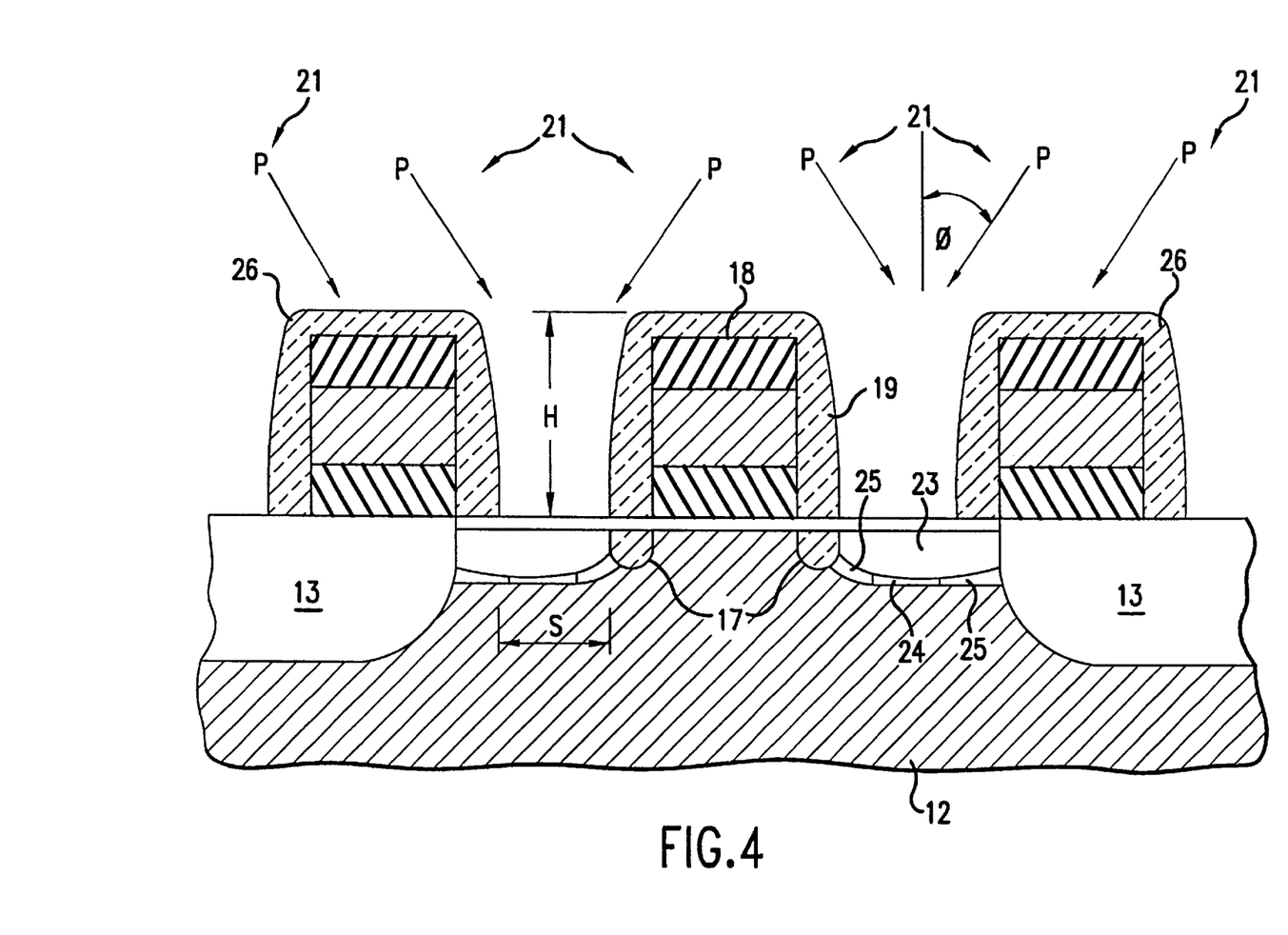

Referring to FIG. 4, after formation of source and drain regions 23, the wafer is subjected to angled low-dosage boron implant 21, using a mask which is usually the same mask as the N+ source/drain mask, to serve as an N-channel punch through voltage enhancement, creating punch through implant regions 24 that extend to the edges of transistor gate 18 and dummy gate 26. Punch through prevention implant 21 introduces dopant into active region 10, and may increase $V_t$ of small devices by as much as several hundred mVs. To form a semiconductor device with an N-channel, the implanted dopant 21 is a dopant having a P-type conductivity such as boron. Dopant 21 is of a different conductivity type to prevent punch through in a channel of the different conductivity type. A P-type dopant is implanted into an N-channel device to prevent punch through. Similarly, an N-type dopant, such as phosphorous, can be implanted into an N-channel device to adjust the threshold voltage in a negative direction.

In conventional silicon processing, the threshold voltage adjustment implant is performed prior to formation of gate structure 18 and spacer 19. In the process of the present invention, the gate structure serves as a mask for the angled implant 21, and the implant 22 (FIG. 3) which creates the source and drain regions.

Although implant 21 is a different conductivity type than implant 22, the implant dose of implant 22 is approximately 3 orders of magnitude higher than the implant dose of implant 21. Therefore, although P-type punch through prevention implant 21 is implanted into N-type source and drain region 23, the lower concentration of P-type dopant 21 does not significantly affect the higher concentration of N-type dopant 22. A similar effect is observed if implant 21 uses an N-type dopant.

Implant 21 is performed at a boron implant dose of approximately $2 \times 10^{11}$ to $8 \times 10^{13}$ atoms/cm$^2$ and an implant energy of approximately 10 to 100 keV, preferably about 40 to 60 keV.

Punch through prevention implants typically create a higher concentration P-type region below the N-type source and drain regions than created in the channel region under gate structures, and thus increase source and drain junction capacitances. This increase in P-N junction capacitance degrades speed and power performance. In order to overcome this problem, the method of the present invention uses an angled implant 21 in which the relatively tall (H) gate structures partially shadow out implant 21. When the implant angle $\phi$ is between 5° and 45° as shown in FIG. 4, and the gate or other structures are sufficiently high so that the implant angle is preferably slightly greater than Arc tangent S/H, where S is the horizontal distance between gate structure 18 and dummy gates 26 (or other structures), only a thin layer of boron is created in region 24 below the source and drain regions. However, a somewhat higher dose of boron is implanted in outer regions 25 of the source and drain. Only about one-half of the usual dose is implanted in the central region 24 of the source and drain because, due to four rotational implants (one for each 90° rotation of the substrate), only two directions are implanted. Due to the four rotational implants, and depending upon the angle $\phi$ and distances (H) and (S), three directions can be implanted into outer regions 25. As a result of the angled implant 21 and shadow effects, the $V_t$ is about 200–300 mv lower than would be achieved without the shadow effects and, more importantly, the junction capacitance between the source to substrate and drain to substrate is reduced, thus increasing device speed. Various different angles, and distances (H) and (S) can be employed in the method of the invention, so long as at least a portion of the implant is shadowed out resulting in gradation of the implanted dopant concentration.

Implants 21 and 22 are subsequently annealed to activate implanted dopants 21 and 22, respectively. The high temperature anneal or rapid thermal anneal is preferably of a short time duration to prevent dopant diffusion associated with long diffusion anneals and to eliminate problems associated with dopant diffusion.

Figure 5:
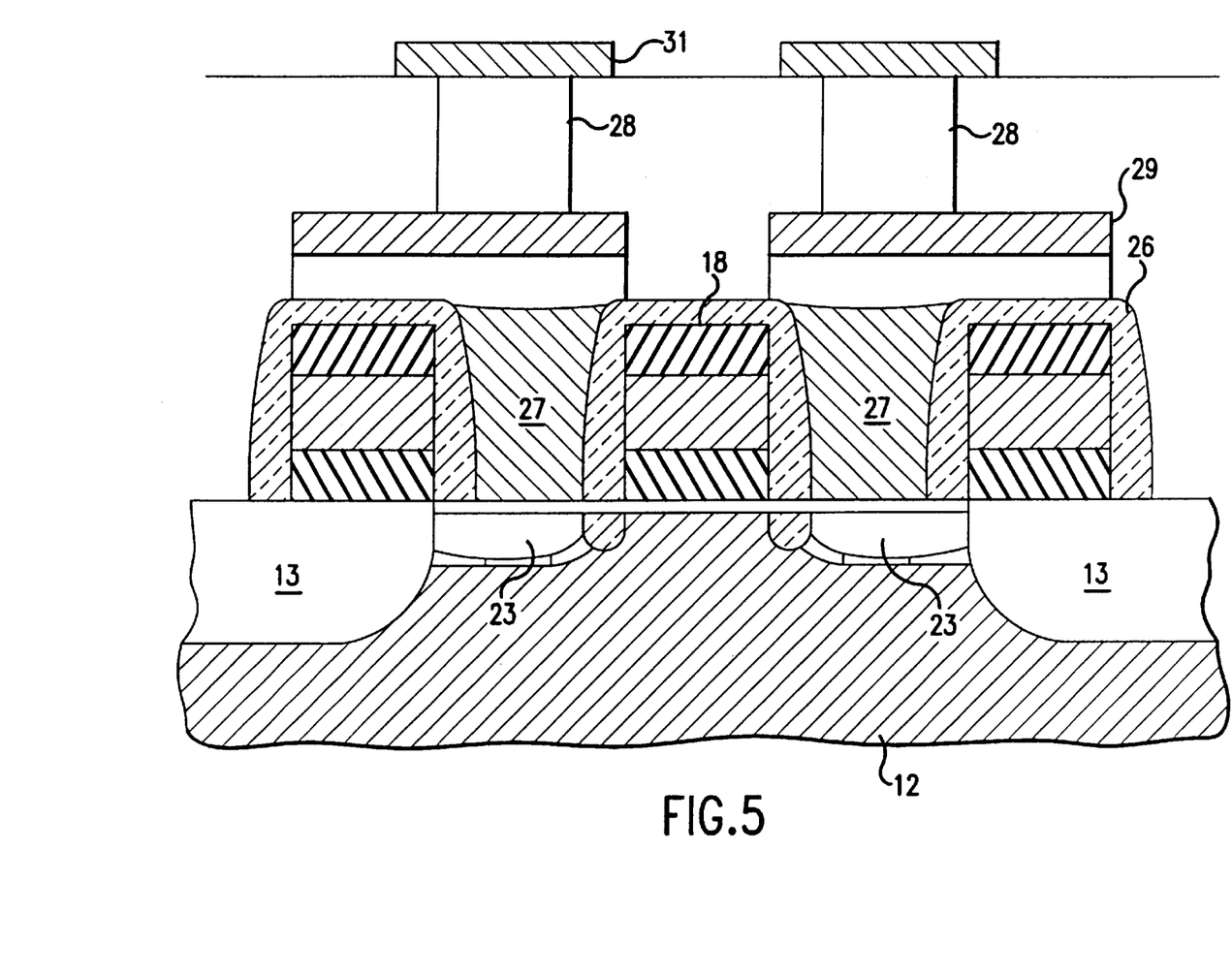
FIG. 5 is a view of the FIG. 1 wafer taken at a step subsequent to that shown by FIG. 4, and shows one method of contact formation to source and drain regions.
Figure 6:
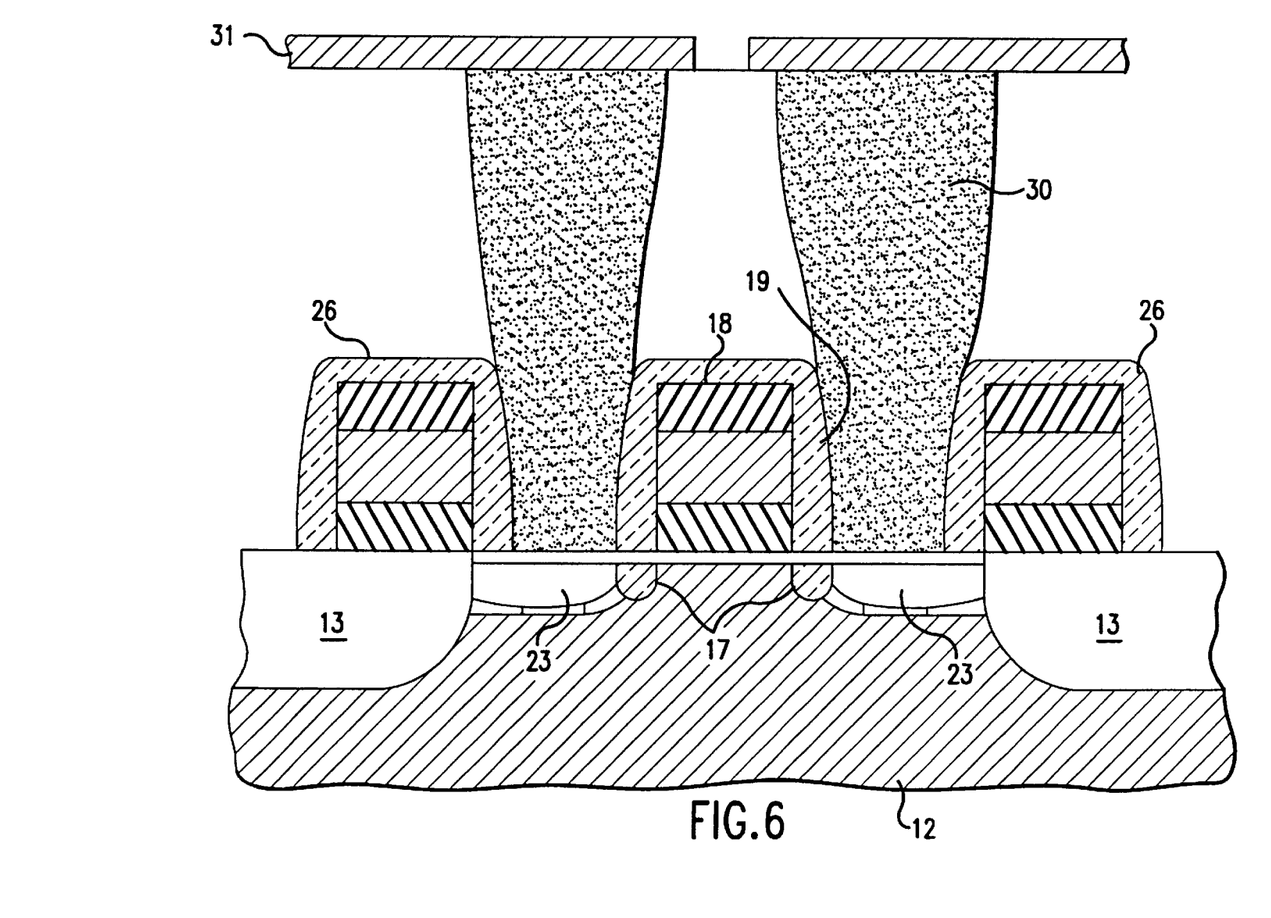
FIG. 6 is a view of the FIG. 1 wafer taken at a step subsequent to that shown by FIG. 4, and shows an alternative method of contact formation to source and drain regions.

Referring now to FIG. 5, conventional processing technology may be used to complete the circuitry. Preferably all structures are first covered by an oxide isolation layer (not shown), which may be doped with phosphorus, boron or both. In FIG. 5, a photomask (not shown) has been used to define contacts 28 from metal layer 31 through oxide isolation layer through which connection to poly plug structures 27 and active area conductive regions below can be made. FIG. 5 shows buried digit line 29 as one preferred embodiment. For example, referring to FIG. 6, an alternative embodiment is shown which utilizes a self-aligned contact etch for tungsten metal contacts 30. Various processing steps known in the art can be used to complete the circuitry.

Figure 7:
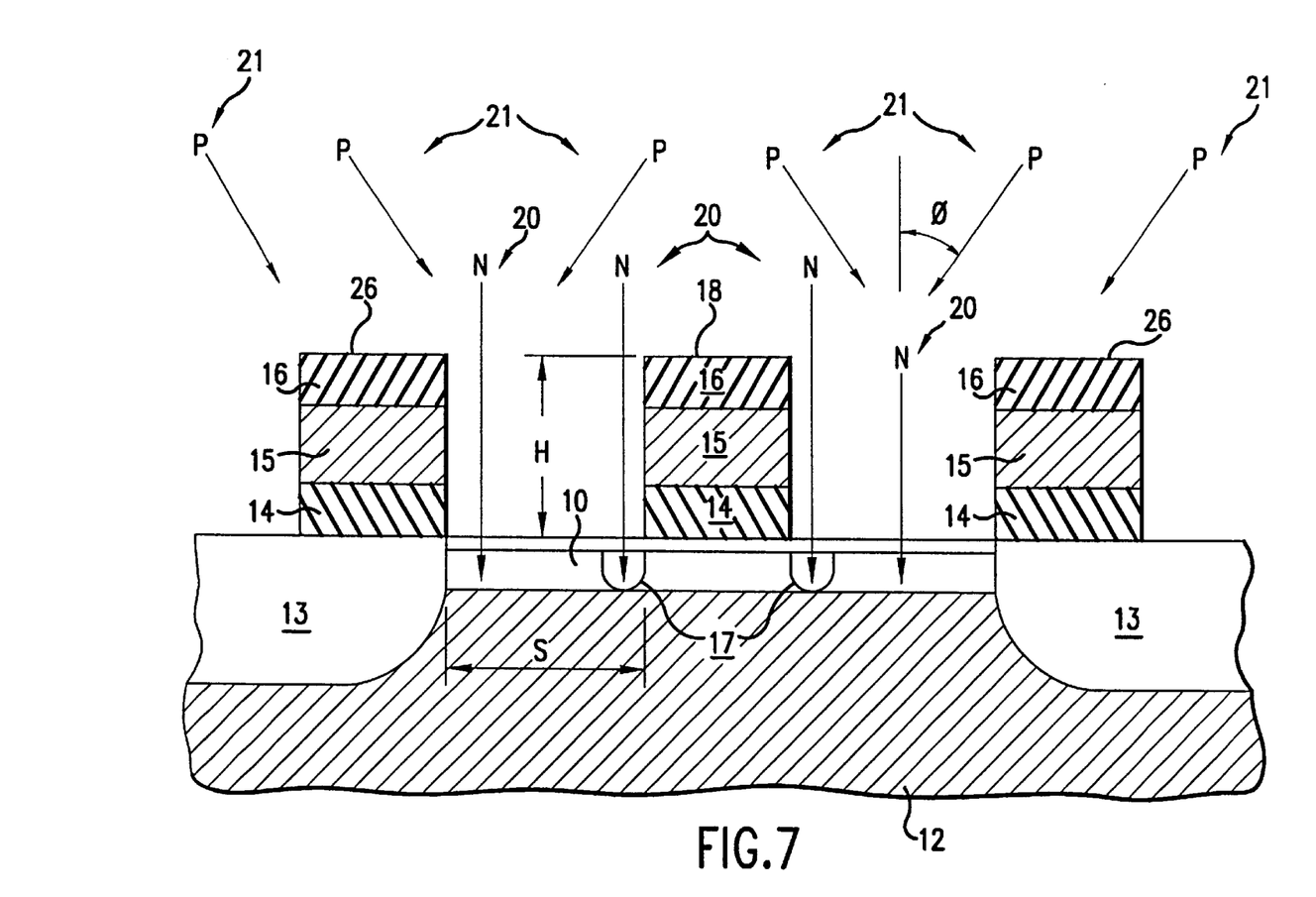
FIG. 7 is an alternative embodiment showing a view of the FIG. 1 wafer taken at a step subsequent to FIG. 1, and shows formation of a lightly doped drain and angled implant for punch through prevention, both prior to spacering of actual gate and dummy gates (or poly runners).

Additional variations of the present invention include interchanging the processing order of source and drain implant 22 and punch through prevention implant 21. In addition, the implant 21 can be formed together with the LDD implant step before spacer formation. FIG. 7 illustrates process steps in this alternative embodiment. Furthermore, the semiconductor manufacturing process embodied in the present invention to produce MOS semiconductor transistor devices can also be used to produce MESFET, CMOS, and BiCMOS devices.

Figure 8A:
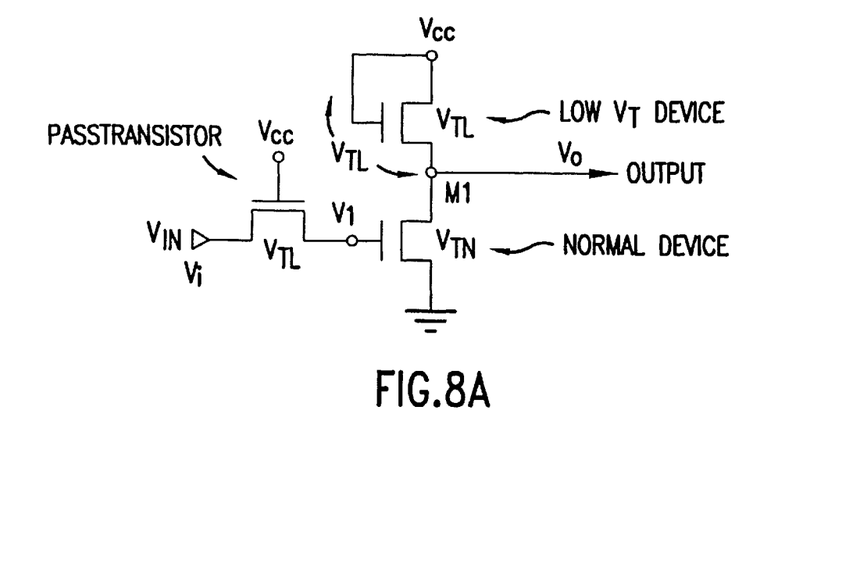
FIG. 8 depicts examples of various circuits containing both low $V_t$ devices and high or normal $V_t$ devices according to the present invention.
Figure 8B:
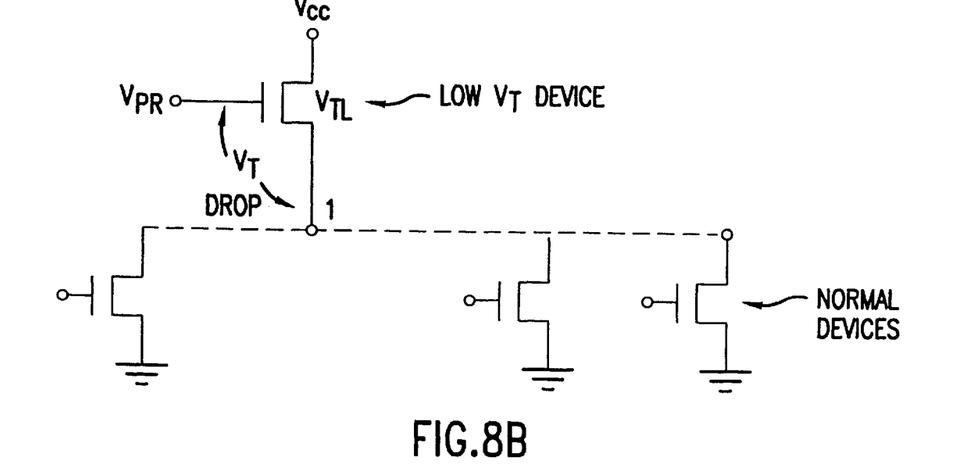
Figure 8C:
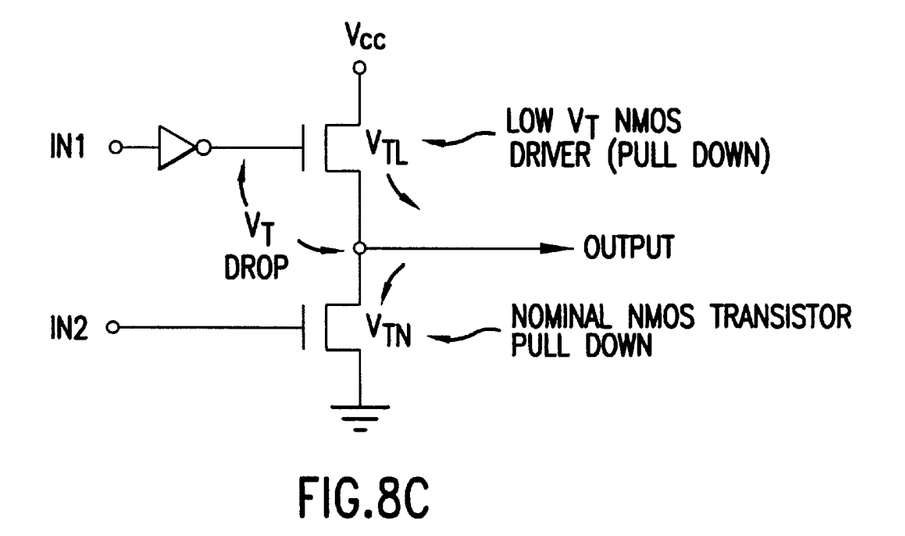

One advantage of the present invention is that low $V_t$ devices may be made on a chip containing normal or high $V_t$ devices without the need for any additional masking step. The invention thus lends itself well to various applications in which low voltage devices are minority devices on a given chip. These applications, include, for example, NMOS pass transistor devices (FIG. 8A), pre-charge circuits (FIG. 8B) and output drivers (FIG. 8C). With reference to FIG. 8A, $V_{TL}$ represents a low threshold voltage device, which preferably has a low $V_t$ so as to maximize output level at VO, due to the $V_t$ drop. Voltage $V_1$ after a pass transistor is preferably high to have good drive on the device M1. The smaller the $V_t$, the lower the drop. With reference to FIG. 8B, the node 1 voltage of the pre-charge circuit $V_{PR}$ is preferably high so that it can properly drive the subsequent driver. Accordingly, a $V_{TL}$ device is provided between $V_{PR}$ and node 1. FIG. 8C shows another circuit in which the output is a $V_t$ drop away from the input voltage $V_{cc}$. Given the disclosure and teachings of the present invention, these and various other circuits can now be conveniently made with both low $V_t$ and high $V_t$ devices without additional or complex processing steps.

Although several embodiments of the improved process have been described herein, it will be apparent to one skilled in the art that changes and modifications may be made thereto without departing from the spirit and the scope of the invention as claimed. The same process flow could be used to create P-channel and N-channel devices on a lightly-doped N-type substrate (arsenic or phosphorus-doped silicon having a conductivity opposite to that of the lightly-doped P-type substrate used to begin the process described in detail heretofore). In such a case, a P-well, rather than an N-well would be created in the substrate, and so forth. Moreover, the process approach explained herein was in the context of a single actual gate, but any structure may be utilized to shadow out the punch through prevention implant. Preferably, such structures are of sufficient height (H) and spacing (S) such that the implant angle is greater than or equal to arc tangent S/H. The structures may include, for example, an actual gate for one device and an adjacent actual gate of another device, or an actual gate for one device and an interconnect structure such as a poly runner for that same or another device.

Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

We claim:

1. A method of manufacturing a semiconductor device of a first conductivity type fabricated on a semiconductor substrate, the method comprising:

providing a semiconductor substrate;

isolating an active region on the semiconductor substrate;

forming a first structure on the active region, said first structure comprising a gate structure;

forming a second structure on the semiconductor substrate, said second structure having a height (H) and being formed at a distance (S) from said gate structure;

implanting a dopant of said first conductivity type to form source/drain regions of said first conductivity type in said substrate, said source/drain regions being adjacent to said gate structure;

implanting a dopant of a second conductivity type through said source/drain regions, wherein said dopant of second conductivity type is implanted at a dosage about three orders of magnitude lower than that of said dopant of said first conductivity type and at an angle with respect to the surface said substrate, and said second structure causes a shadow effect upon implantation of said dopant of second conductivity type such that the amount of dopant of second conductivity type implanted increases approaching said gate structure from a point in the active region about one-half the distance (S) from said gate structure.

2. The method of claim 1 wherein said angle is at least about Arc tangent S/H.

3. The method of claim 1, wherein said dopant of said first conductivity type is implanted with a first implant energy and with a first implant dose, wherein the gate structure prevents said dopant from penetrating the active region under the gate structure during implanting of said dopant of said first conductivity type.

4. The method of claim 3 wherein said step of implanting a dopant of the first conductivity type is performed prior to implanting said dopant of a second conductivity type.

5. The method of claim 1 further including implanting the dopant of a second conductivity with an implant energy of about 10 keV to 100 keV.

6. The method of claim 5 further including implanting the dopant of a second conductivity with an implant dose of about $2 \times 10^{11}$ atoms/cm$^2$ to $8 \times 10^{13}$ atoms/cm$^2$.

7. The method of claim 6 further including implanting boron for the dopant of a second conductivity.

8. The method of claim 1 wherein said gate structure does not include side spacers.

9. The method of claim 1 further comprising the step of forming side spacers on said gate structure and wherein said step of implanting a dopant of said second conductivity type is performed prior to forming said side spacers.

10. The method of claim 1 wherein forming the second structure includes providing a dummy gate structure.

11. The method of claim 1 further including forming a spacer on the active region and in contact with the gate structure.

12. The method of claim 9 wherein said dopant of a first conductivity and said dopant of a second conductivity are implanted after formation of said spacer.

13. The method according to claim 10, further including implanting a third dopant into the active region, wherein the third dopant is of the first conductivity and is implanted before formation of said spacer.

14. A method of manufacturing a semiconductor device, the method comprising:

providing a substrate;

isolating an active region on the substrate;

forming a first structure of a first height on the active region, said first structure comprising a gate structure;

forming a second structure of a second height at a first distance from the first structure;

implanting a dopant of said first conductivity type to form a source/drain region between said first and second structures, said source/drain region being of said first conductivity type implanting a dopant of second conductivity type into the active region and under said source/drain region such that the amount of dopant implanted increases approaching said gate structure from a point in the active region about one-half the distance between said first structure and said second structure, wherein the dopant of second conductivity type is implanted at an angle greater than or equal to Arc tangent of the product of the second height and the inverse of the first distance and the implant dose of said dopant of second conductivity type is about three orders of magnitude lower than that of said dopant of said first conductivity type, and said dopant continuously extends between said first structure and said second structure.

15. The method of claim 14 further including implanting the dopant of second conductivity type with an implant energy of about 10 keV to 100 keV.

16. The method of claim 15 further including implanting the dopant of second conductivity type with an implant dose of about $2 \times 10^{11}$ atoms/cm$^2$ to $8 \times 10^{13}$ atoms/cm$^2$.

17. The method of claim 14 further including implanting boron for the dopant of second conductivity type.

18. The method of claim 14 further including implanting phosphorous for the dopant of second conductivity type.

19. The method of claim 14 further including implanting the dopant of second conductivity type into the active region wherein the first height of the gate structure is similar to the second height of the second structure during implanting of the dopant of second conductivity type.

20. The method of claim 14 wherein the dopant of second conductivity type is implanted at an angle of from 5° to 45° with respect to said substrate.

21. A method of manufacturing a semiconductor device with a channel of a first conductivity type, the method comprising:

providing a silicon substrate;

isolating an active region on the silicon substrate;

forming a first structure having a height on the active region, said first structure comprising a gate structure;

forming a second structure having height (H) and being separated from the gate structure by a first distance (S);

implanting a first dopant of the first conductivity type into the active region, wherein the gate structure blocks the first dopant from penetrating the active region under the gate structure during implanting of the first dopant;

implanting a second dopant of a second conductivity type into the active region such that the amount of second dopant implanted is about three orders of magnitude less than that of said first dopant and said amount of second dopant increases approaching said gate structure from a point in the active region about one-half the distance (S) from said gate structure, wherein the second dopant is implanted at an angle such that the relationship between the height of the second structure and the distance between the second structure and the gate structure blocks direct implant of the second dopant into at least a portion of the active region; and annealing the first dopant and the second dopant, wherein one of said first dopant and said second dopant is N-type and the other of said first dopant and said second dopant is P-type.

22. The method of claim 21 wherein the relationship between H and S is such that the implant angle for the second dopant is at least about the arc tangent of S/H.

23. A method of manufacturing a semiconductor device, the method comprising:

providing a semiconductor substrate;

isolating an active region in the semiconductor substrate;

forming a first structure over a portion of the active region, said first structure comprising a gate structure;

forming a second structure spaced apart a horizontal distance from said gate structure;

implanting a first dopant into the active region, said first dopant being of said first conductivity type, the gate structure preventing the first dopant from penetrating the active region under the gate structure during implanting of the first dopant;

implanting a second dopant of a second conductivity type into the active region such that the amount of second dopant implanted is about three orders of magnitude less than that of said first dopant and said amount of second dopant increases approaching said gate structure from a point in the active region about one-half the distance (S) from said gate structure, the second dopant penetrating the active region below said first dopant implant, wherein the second dopant is implanted at an angle directly into a first portion of the active region but blocked by the gate and second structures such that the second dopant diffuses into a second portion of the active region; and implanting a third dopant into the active region, wherein the third dopant is of said first conductivity type and does not penetrate the active region under the gate structure.

24. The method of claim 1, wherein said semiconductor device is a CMOS transistor.

25. The method of claim 24, wherein said implanting of said dopant of said second conductivity type lowers the threshold voltage and parasitic junction capacitance of said transistor.

26. The method of claim 14, wherein said semiconductor device is a CMOS transistor.

27. The method of claim 26, wherein said implanting of said dopant of said second conductivity type lowers the threshold voltage and parasitic junction capacitance of said transistor.

28. The method of claim 21, wherein said semiconductor device is a CMOS transistor.

29. The method of claim 28, wherein said implanting of said dopant of said second conductivity type lowers the threshold voltage and parasitic junction capacitance of said transistor.

30. The method of claim 23, wherein said semiconductor device is a CMOS transistor.

31. The method of claim 30, wherein said implanting of said dopant of said second conductivity type lowers the threshold voltage and parasitic junction capacitance of said transistor.

* * * * *